United States Patent [19]
Givens

[11] Patent Number: 6,060,386
[45] Date of Patent: May 9, 2000

[54] METHOD AND APPARATUS FOR FORMING FEATURES IN HOLES, TRENCHES AND OTHER VOIDS IN THE MANUFACTURING OF MICROELECTRONIC DEVICES

[75] Inventor: John H. Givens, Meridian, Id.

[73] Assignee: Micron Technology, Inc., Boise, Id.

[21] Appl. No.: 08/917,669

[22] Filed: Aug. 21, 1997

[51] Int. Cl.[7] .............................................. H01L 21/4763
[52] U.S. Cl. .......................... 438/626; 438/631; 438/632; 438/637; 438/645; 438/646; 438/660; 438/661; 438/672; 438/675; 438/937
[58] Field of Search .................................. 438/626, 631, 438/632, 637, 645, 646, 660, 661, 672, 675, 937

[56] References Cited

U.S. PATENT DOCUMENTS

| | | | |
|---|---|---|---|
| 5,308,792 | 5/1994 | Okabayashi et al. | 437/180 |
| 5,434,107 | 7/1995 | Paranjpe | 437/225 |
| 5,547,902 | 8/1996 | Rohner | 437/187 |
| 5,668,055 | 9/1997 | Xu et al. | 438/637 |

*Primary Examiner*—Richard Booth
*Assistant Examiner*—David A. Zarneke
*Attorney, Agent, or Firm*—Perkins Coie LLP

[57] ABSTRACT

The present invention is a method and apparatus for filling voids in a substrate with a desired material to form conductive components and/or other features on the substrate. In one embodiment in accordance with the principles of the present invention, a substrate with voids is covered with a first layer of material and then a second layer of material is formed on top of the first layer. The first layer is deformable at a deformation temperature, while the second layer has a higher yield strength than the first layer and is substantially non-deformable at the deformation temperature. The second layer, for example, may be a rigid and/or substantially incompressible layer that distributes a driving force to the first layer. The second layer is then pressed against the first layer at a temperature equal to or greater than the deformation temperature to drive portions of the first layer into the voids in the substrate. The portion of the first layer in the voids may accordingly be used to form features of a device.

49 Claims, 6 Drawing Sheets

METHOD AND APPARATUS FOR FORMING FEATURES IN HOLES, TRENCHES AND OTHER VOIDS IN THE MANUFACTURING OF MICROELECTRONIC DEVICES

TECHNICAL FIELD

The present invention relates to forming features in the manufacturing of microelectronic devices. More specifically, the invention relates to filling depressions or voids on a substrate with a desired material to form conductive components or other types of features on a plurality of microelectronic devices.

BACKGROUND OF THE INVENTION

Microelectronic devices are used in computers, communications equipment, televisions and many other products. Typical microelectronic devices include processors, memory devices, field emission displays and other devices that have circuits with small, complex components. In current manufacturing processes, the components of such circuits are generally formed on a substrate or wafer with conductive, insulative and semiconductive materials. Each substrate typically has 50–200 microelectronic devices, and each microelectronic device may have several million components.

Because fabricating microelectronic devices generally involves forming electrical components at a number of layers and different locations, microelectronic devices generally have many conductive features to couple the various components together. Common conductive features in microelectronic devices include conductive lines formed in trenches in a dielectric layer (e.g., damascene lines) or interlayer contact plugs/vias formed in holes through a dielectric layer. Accordingly, the trenches for the conductive lines and the holes for the contact plugs are typically filled with aluminum, tungsten, copper, gold, silver, polysilicon or other suitable conductive materials.

One problem with conventional process for fabricating conductive features is that some of the conductive features may have defects that impact the performance of the resulting circuit. Conventional processes for filling contact holes or trenches with conductive materials typically involve covering a dielectric layer with a layer of conductive material, heating the conductive layer until it is deformable, and then applying pressure directly to the conductive layer to drive a portion of the conductive layer into the contact holes or trenches. Because the contact holes and trenches generally have a high aspect ratio (the ratio of height/width), small cracks often form in the conductive layer as it is deposited onto the dielectric layer. The existing cracks in the conductive layer often propagate as pressure is applied to the conductive layer and, if large enough, cause defects in the resulting conductive component. Thus, conductive components fabricated with conventional processes for filling contact holes or trenches may impair the performance of the resulting microelectronic devices.

Another problem with conventional processes for fabricating conductive features is that it is often time-consuming to prepare the substrate for subsequent processing. After the conductive material fills the contact holes or trenches, the substrate is typically planarized to the top of the underlying dielectric layer to electrically isolate the conductive features from one another and to provide a highly planar surface for accurately photopatterning additional layers of components. One desirable technique for planarizing substrates is chemical-mechanical planarization ("CMP") in which a substrate is moved across a polishing medium to remove material from the substrate. Although CMP processes produce a planar surface, they are time-consuming and require sophisticated equipment. Accordingly, it is generally desirable to planarize the surface without CMP processing, or to reduce the time required to planarize the surface with CMP processing.

SUMMARY OF THE INVENTION

The present invention is a method and apparatus for filling voids in a substrate with a desired material to form conductive components and/or other features on the substrate. In one embodiment in accordance with the principles of the present invention, a substrate with voids is covered with a first layer of material and then a second layer of material is formed on top of the first layer. The first layer is deformable at a deformation temperature, while the second layer has a higher yield strength than the first layer and is substantially non-deformable at the deformation temperature. The second layer, for example, may be a rigid and/or substantially incompressible layer that distributes a driving force to the first layer. The second layer is then pressed against the first layer at a temperature equal to or greater than the deformation temperature to drive portions of the first layer into the voids in the substrate. The portions of the first layer in the voids may accordingly be used to form features of a device.

Although the invention is applicable to filling virtually any type of void on a substrate with a desired material, it is particularly useful for forming conductive components in contact holes and/or trenches in a dielectric layer. For example, the first layer may be composed of aluminum, silver, copper, gold or other suitable conductive materials. Additionally, the second layer may be composed of silicon nitride, silicon oxide, titanium, tungsten or other suitable rigid and/or incompressible materials. In operation, the substrate may be placed in an oven and heated to a temperature at which the conductive first layer is deformable. The oven is then pressurized to apply pressure to the exposed surface of the second layer, which drives the second layer against the first layer. The second layer distributes the force induced by the pressure to the first layer to inhibit stress concentrations in the first layer that could produce new cracks or propagate existing cracks in the first layer. One advantage of an embodiment of the invention, therefore, is that it may reduce the number of defects in conductive features.

DETAILED DESCRIPTION OF THE INVENTION

The present invention is a method and apparatus for filling voids in substrates with desired materials to form conductive components and other features in the manufacturing of microelectronic devices. One aspect of an embodiment of the invention is to fill voids in a substrate with portions of a first layer of material by driving a second layer against the first layer. The second layer is generally composed of a material that has a higher yield strength than the first layer. For example, the second layer may be composed of a material that is substantially rigid and/or incompressible at a temperature at which the first layer is deformable to distribute the driving force to the first layer in a manner that inhibits forming new cracks or propagating existing cracks in the first layer. It will be appreciated that specific details of the invention are set forth in the following description and in FIGS. 1A–3I to provide a thorough understanding of certain embodiments of the present invention. One skilled in the art, however, will understand that the present invention may have additional embodiments and may be practiced without these details.

Figure 1A:
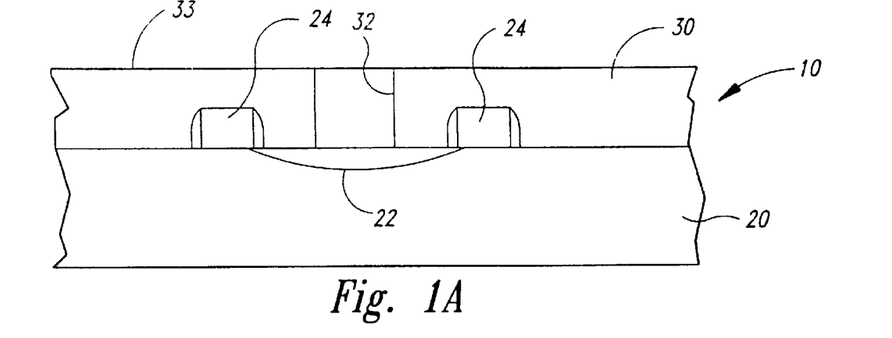
FIG. 1A is a partial schematic cross-sectional view of a substrate upon which a contact plug is to be fabricated according to an embodiment of a method in accordance with the invention.
Figure 1B:
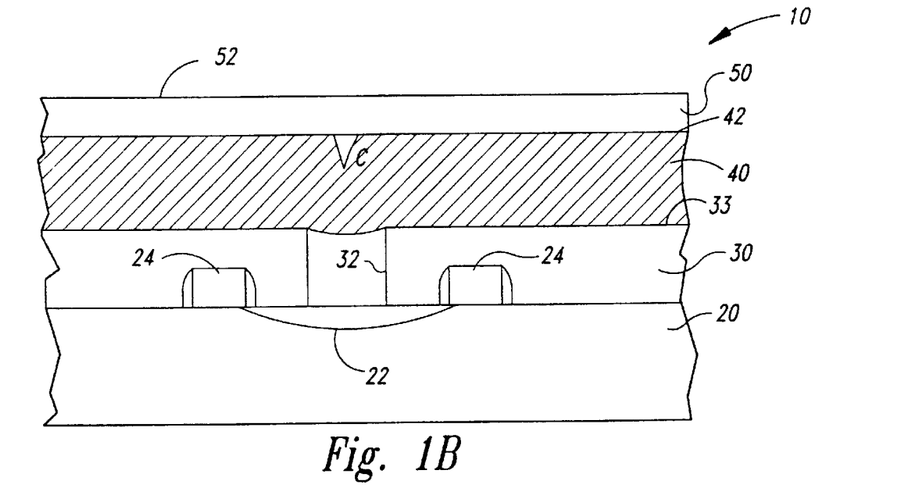
FIG. 1B is a partial schematic cross-sectional view of the substrate of FIG. 1A at a subsequent point of the method.
Figure 1C:
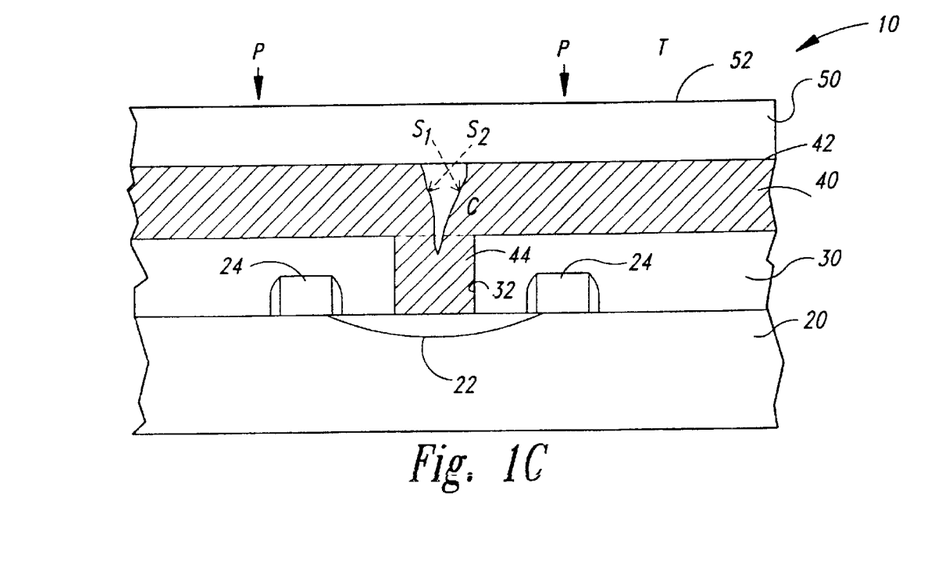
FIG. 1C is a partial schematic cross-sectional view of the substrate of FIGS. 1A and 1B at a subsequent point of the method.

FIGS. 1A–1C are partial schematic cross-sectional views that illustrate fabricating a contact plug on a substrate 10 according to one embodiment of the invention. The substrate 10 may be a semiconductor wafer or other type of substrate commonly used for fabricating microelectronic devices. Referring to FIG. 1A, the substrate 10 may have a base layer 20 in which at least one feature 22 is formed by doping the base layer 20 with appropriate materials or growing the materials on the base layer 20. The base layer 20 may be composed of silicon or other suitable materials, and the feature 22 may be a well, source, drain, field oxide or other type of feature. A number of components 24 are also formed on the base layer 20 to operate in conjunction with the feature 22. The components 24 may be gates, word lines or other components.

After forming the feature 22 and the components 24, a passivation or barrier layer 30 is deposited over the substrate 10. The barrier layer 30 is generally a dielectric layer composed of silicon oxide, borophosphate silicon glass (BPSG), tetraethylorthosilicate (TEOS) or other suitable insulative materials. The barrier layer 30 illustrated in FIG. 1A has been planarized so that it has a substantially planar top surface 33. Additionally, avoid or depression 32 may be formed through the barrier layer 30 by patterning the top surface 33 with a resist material, and then anisotropically etching the exposed portion of the barrier layer 30. The void 32 illustrated in FIG. 1 is a contact hole, and the patterning and etching processes for forming the contact hole 32 are well known in the art. In many microelectronic devices, the void 32 has an aspect ratio of 8:1 (i.e., the height of the void is eight times its width or diameter). After forming the contact hole 32 in the barrier layer 30, the contact hole 32 is filled with a conductive material to electrically couple the feature 22 with another component or feature on the substrate 10 (not shown).

FIG. 1B illustrates an initial stage of a method for force filling the contact hole 32 with a desired material. The top surface 33 of the barrier layer 30 is covered with a first layer or component layer 40, and then the first layer 40 is covered with a second layer or mechanical layer 50. In this embodiment, the first layer of material 40 is composed of aluminum, copper, gold, silver or other suitable conductive materials that have a relatively low yield strength. The conductive layer 40 shown in this embodiment extends only to an intermediate point within the contact hole 32 at this stage of the method because typical contact holes 32 have a high aspect ratio that prevents the conductive material from completely filling the contact holes.

The second layer 50 may be composed of a material that has a higher yield strength than the conductive material of the first layer 40 so that the second layer 50 acts as a mechanical plate over the first layer 40. The second layer 50, for example, may be composed of a substantially incompressible material that is more rigid than the first layer 40. The specific composition of the second layer 50 often, but not always, depends upon the composition of the first layer 40. In general, the first layer 40 is composed of a material that is deformable at a deformation temperature, but the second layer 50 is composed of a material that is substantially non-deformable at the deformation temperature. However, in some embodiments, the second layer 50 may also be deformable at approximately the same temperature as the first layer. When the first layer 40 is a conductive material for forming a contact plug, suitable materials from which the second layer 50 may be composed include ceramic materials (e.g., silicon oxide and silicon nitride), high yield strength metals (e.g., titanium and tungsten), and alloys of high yield strength metals and metal oxides.

FIG. 1C illustrates a subsequent stage in the method of FIGS. 1A–1B for force filling the contact hole 32 with a portion of the first layer 40. In one embodiment, the second layer 50 is driven downwardly by applying a pressure P to an exposed surface 52 of the second layer 50. The pressure P applied to the second layer 50 is generally a function of the materials of the first and second layers 40 and 50, the shape of the void being filled, and the temperature of the substrate 10. The pressure P, for example, may be applied to the second layer 50 at a temperature T such that the yield point of the first layer 40 is substantially less than the second layer 50. The second layer 50 accordingly distributes the pressure P across the top surface 42 of the first layer 40 to act as a mechanical plunger that presses against the deformable first layer 40 and drives a portion of the first layer 40 into the contact hole 32. At this point, the second layer 50 and the excess portion of the first layer 40 above the top surface 33 of the barrier layer 30 are removed by suitable means, such as by planarizing the wafer 10 to electrically isolate a contact plug 44 (illustrated by a dashed line at the level of the top surface 33) in the contact hole 32.

In one specific embodiment for forming a contact plug 44 in a contact hole 32 with an aspect ratio of 8:1, the first layer 40 is composed of aluminum and the second layer 50 is composed of silicon nitride, silicon dioxide, tantalum oxide, titanium oxide or another suitable ceramic material. The substrate 10 is placed in an environment at a temperature between approximately 400° C. and 600° C., and a pressure between approximately 500 and 1000 atmospheres is applied to the exposed surface 52 of the second layer 50. More particularly, the substrate 10 may be placed in a pressure oven known in the art at a temperature of 480° C. to 520° C. and a pressure of between approximately 700 and 750 atmospheres is applied to the exposed surface 52. The above temperatures and pressures are but a few examples of temperatures and pressures to fill an 8:1 void with aluminum. It will be appreciated that the temperatures and pressures suitable for force filling voids in accordance with the invention are a function of the structure of the voids and the materials of the first and second layers. When the first layer 40 is composed of copper or gold, for example, the temperatures and pressures will generally be higher than those for aluminum first layers. The specific temperatures and pressures for a specific structure and conductive layer may be ascertained by a person skilled in the art without undue experimentation.

One advantage of the method described in FIGS. 1A–1C is that it generally reduces defects in conductive components formed on semiconductor wafers and other types of substrates. As best shown in FIG. 1B, a crack C (shown exaggerated) may exist in the first layer 40 after the first layer 40 is deposited onto the substrate 10. Conventional filling processes do not have a second layer 50 over the first layer 40, and thus conventional processes apply pressure directly to the first layer 40. As best shown in FIG. 1C, applying the pressure directly to the top surface 42 induces transverse forces S1 and S2 to act against the walls of the crack C. The transverse forces S1 and S2 create a stress concentration that may propagate the crack C to a point at which it forms a defect in the contact plug 44. In the embodiment of the present invention illustrated in FIGS. 1A–1C, however, the second layer 50 distributes the pressure over the first layer 40 and ensures that it is exerted in a direction normal to the surface of the first layer rather than in a transverse direction thereby preventing stress concentrations at cracks in the top surface 42. Accordingly, this embodiment of the invention is expected to reduce the number of defects in the conductive features.

Another advantage of the method described in FIGS. 1A–1C is that it generally enhances the performance of subsequent planarization processes to remove the second layer 50 and the excess portion of the first layer 40. Referring to FIG. 1C, the second layer 50 and the excess portion of the first layer 40 above the top surface 33 of the barrier layer 30 may be removed by CMP processes in which materials are removed from the surface of the substrate with an abrasive polishing medium. CMP processes generally produce more uniformly planar surfaces when the CMP processes begin with a substantially planar substrate compared to a highly topographical substrate. Since the exposed surface 52 of the second layer 50 is substantially planar prior to CMP processing, subsequent CMP processing will likely produce a highly planar surface on the substrate 10. Additionally, since the exposed surface 52 of the second layer 50 is substantially planar, the substrate 10 may be planarized with a fast etching process to remove the second layer 50 and the excess portion of the first layer 40. Therefore, this embodiment of the invention may also reduce the processing time for planarizing the substrate 10.

Figure 2A:
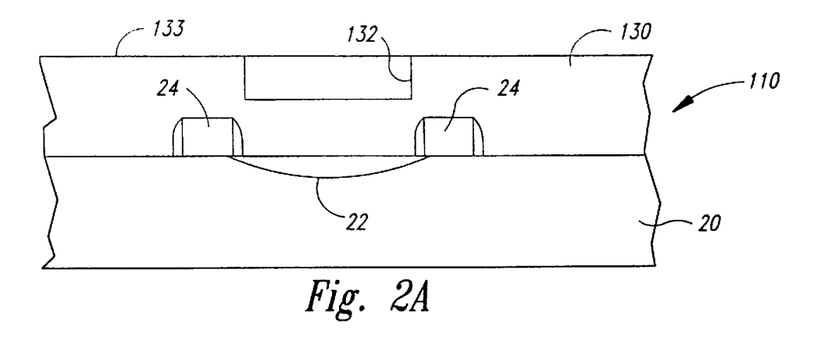
FIG. 2A is a partial schematic cross-sectional view to another substrate upon which a conductive line is to be fabricated according to another embodiment of a method in accordance with the invention.
Figure 2B:
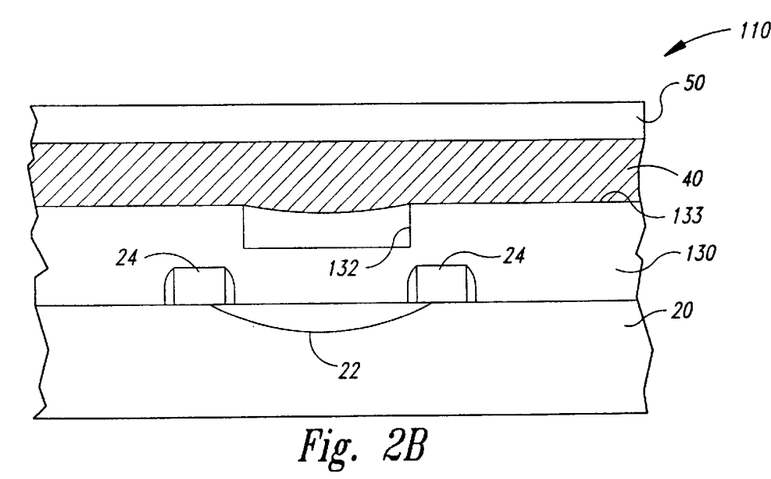
FIG. 2B is a partial schematic cross-sectional view of the substrate of FIG. 2A at a subsequent point of the method.
Figure 2C:
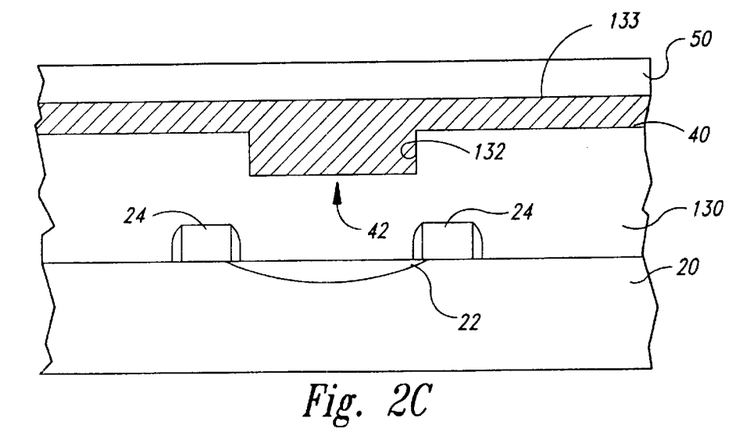
FIG. 2C is a partial cross-sectional view of the substrate of FIGS. 2A and 2B at a subsequent point of the method.

FIGS. 2A–2C are partial schematic cross-sectional views of a substrate 110 upon which a conductive line (e.g., damascene line) is fabricated according to another embodiment of a method in accordance with the invention. FIG. 2A illustrates a substrate 110 with a base layer 20, at least one feature 22 and a number of components 24 formed on the base layer 20 as described above with respect to FIGS. 1A–1C. The substrate 110 also has a barrier layer 130 in which the void or depression is a trench 132 extending along a top surface 133 of the barrier layer 130. The trench 132 may be fabricated by patterning the top surface 133 with a resist material and anisotropically etching the exposed portion of the barrier layer 130 with processes known in the art.

FIG. 2B illustrates the substrate 110 at a subsequent point in the method in which the top surface 133 of the barrier layer 130 is covered with the first layer 40, and the first layer 40 is covered with the second layer 50. The first and second layers 40 and 50 on the substrate 110 are the same as described above with respect to FIGS. 1A–1C. Accordingly, the first layer 40 is generally a deformable or ductile layer at a first temperature, and the second layer 50 generally has a higher yield strength than the first layer 40 so that the second layer 50 is substantially non-deformable and/or substantially incompressible at the first temperature.

FIG. 2C illustrates the substrate 110 after applying pressure to the second layer 50 to drive at least a portion of the first layer 40 into the trench 132. At this point, the second layer 50 and the excess portion of the first layer 40 are removed such as by planarizing the substrate 110 to electrically isolate a conductive line 134 in the trench 132. It will be appreciated that the advantages of forming the conductive line 134 are substantially the same as those described above with respect to forming the contact plug 34 in FIG. 1C.

Figure 3A:
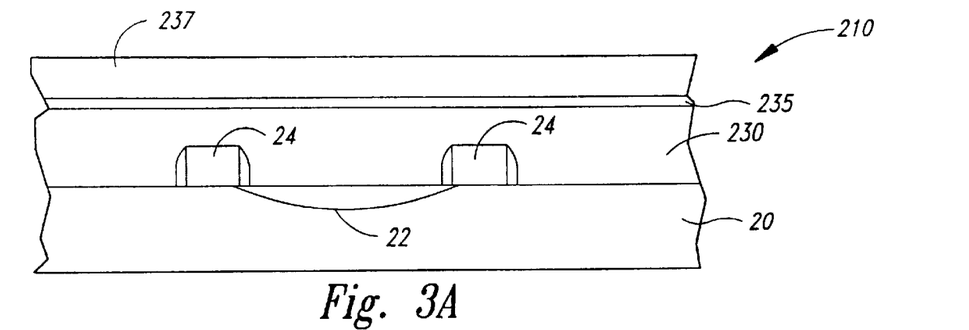
FIG. 3A is a partial schematic cross-sectional view of another substrate upon which a dual damascene conductive structure is to be fabricated according to another embodiment of a method in accordance with the invention.

FIGS. 3A–3E are partial schematic cross-sectional views illustrating another embodiment of a method in accordance with the invention for fabricating a dual damascene conductive structure on a substrate 210. FIG. 3A illustrates the substrate 210 prior to forming the voids for the dual damascene structure. At this point in the method, the substrate 210 may have a base layer 20, at least one feature 22 and a number of components 24 similar to those on the substrate 10 described above in FIGS. 1A–1C. The substrate 210 also has a first barrier layer 230 composed of a dielectric material, an etch stop layer 235 and a second barrier layer 237 on top of the etch stop layer 235. The second barrier 237 is selectively etchable with respect to the etch stop layer 235 so that the second barrier layer 237 may be etched to the depth of the etch stop layer 235. In one embodiment, the first and second barrier layers 230 and 237 are composed of BPSG and the etch stop layer 235 is composed of silicon nitride. Suitable etchants for selectively etching the second barrier 237 down to the etch stop layer 235 are well known in the art. Additionally, other combinations of selectively etchable materials for the second barrier layer 237 and the etch stop layer 235 are also known in the art.

Figure 3B:
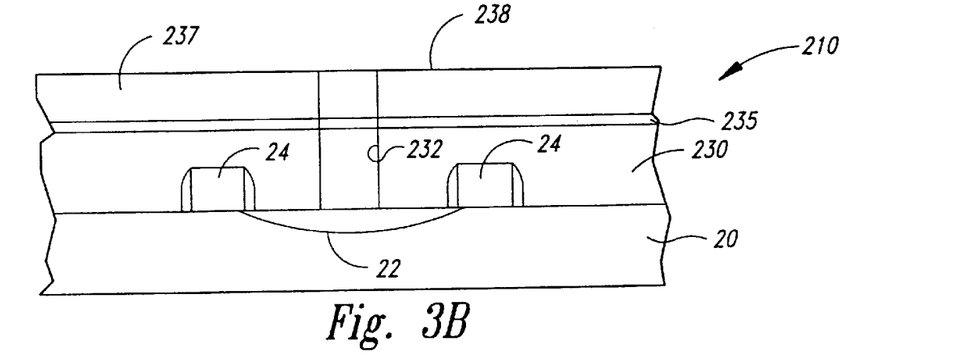
FIG. 3B is a partial schematic cross-sectional view of the substrate of FIG. 3A at another point of the method.
Figure 3C:
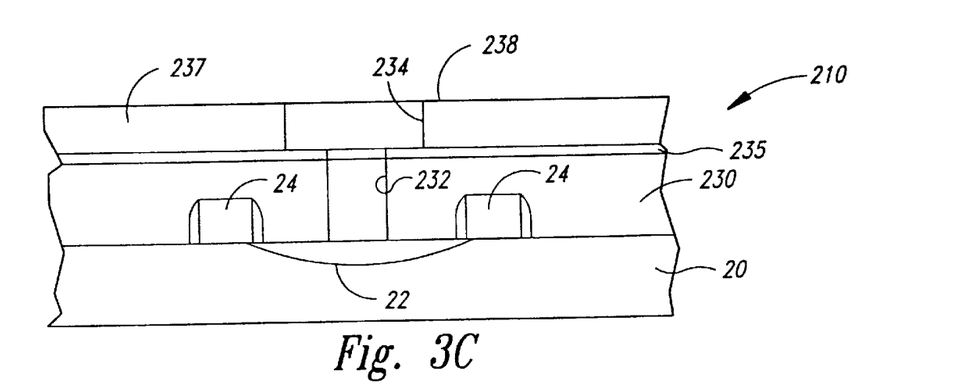
FIG. 3C is a partial schematic cross-sectional view of the substrate of FIGS. 3A and 3B at a subsequent point of the method.

FIG. 3B illustrates an initial stage in the method for forming a dual damascene structure in which a hole 232 is bored through the first barrier layer 230, the etch stop layer 235 and the second barrier layer 237. The hole 232 may be bored through these layers by patterning a top surface 238 of the second barrier layer 237 with a resist, and then anisotropically etching the substrate 210 with an etchant that is not selective to the first barrier layer 230, the etch stop layer 235, or the second barrier layer 237. FIG. 3C illustrates a subsequent stage in the method in which a trough or trench 234 is formed in the second barrier layer 237 down to the etch stop layer 235 by suitable means, such as by patterning the substrate 210 to expose a portion of the second barrier layer 237 over the hole 232. The second barrier layer 237 may then be selectively etched with an etchant that does not remove material from the etch stop layer 235. In a typical dual damascene structure, a plurality of holes 232 are arranged in a line across the substrate 210 and the trench 234 extends in a line over the plurality of holes 232.

Figure 3D:
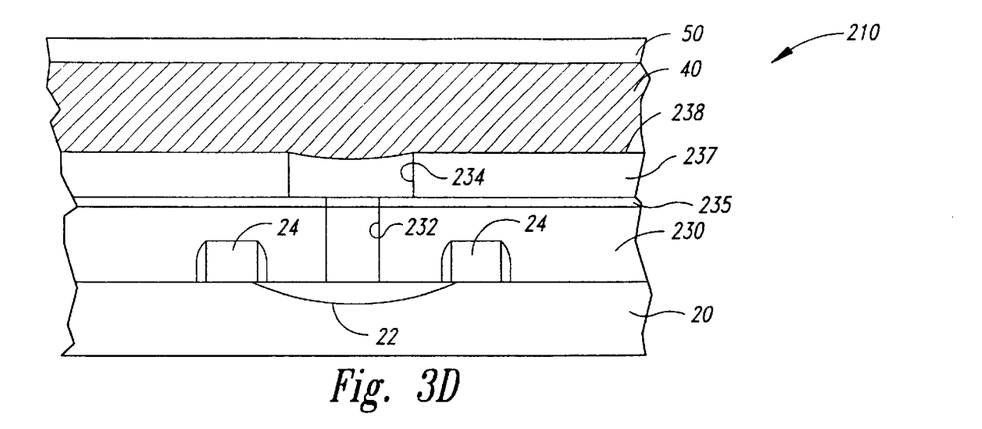
FIG. 3D is a partial schematic cross-sectional view of the substrate of FIGS. 3A–3C at a subsequent point of the method.
Figure 3E:
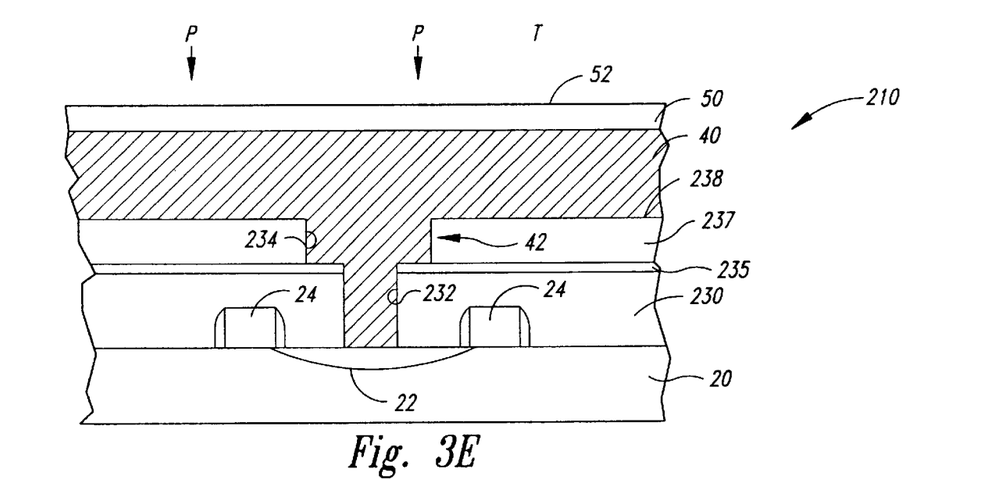
FIG. 3E is a partial schematic cross-sectional view of the substrate of FIGS. 3A–3D at a subsequent point of the method.

FIGS. 3D and 3E illustrate a subsequent stage in the method for forming the dual damascene structure in which the hole 232 and the trench 234 are filled with a conductive material. Referring to FIG. 3D, the first layer 40 is deposited over the top surface 238 of the second barrier layer 237, and then the second layer 50 is deposited on the first layer 40. As described above, the first layer 40 may be composed of aluminum, silver, copper, gold or other suitable conductive materials, and the second layer 50 may be composed of a material that has a higher yield strength than the first layer 40. Thus, as shown in FIG. 3E, a pressure P applied to the exposed surface 52 at the temperature T drives the second layer 50 against the first layer 40 until a component portion 42 of the first layer 40 fills the hole 232 and the trench 234. After a sufficient portion of the first layer 40 fills the hole 232 and the trench 234, the substrate 210 may be manipulated to form various components from the first layer 40.

Figure 3F:
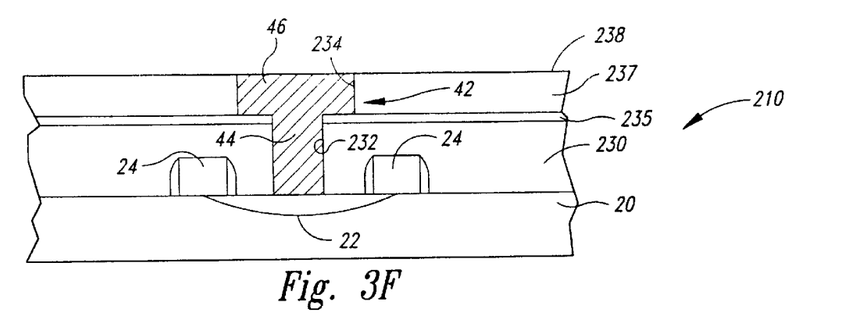
FIG. 3F is a partial schematic cross-sectional view of the substrate of FIGS. 3A–3E at a subsequent point of the method.

FIG. 3F illustrates an embodiment of the method in which the substrate 210 shown in FIG. 3E is manipulated to electrically isolate the conductive material in the trench by completely removing the second layer 50 and the excess portion of the first layer 40. The second layer 50 and the excess portion of the first layer 40 may be removed by planarizing the substrate 210 with a CMP process or an etching process. The resulting conductive component 42 has a contact plug 44 positioned in the hole 232 and a damascene line 46 positioned in the trench 234. In this embodiment, the damascene line 46 is co-planar with the planarized surface of the second barrier layer 237.

Figure 3G:
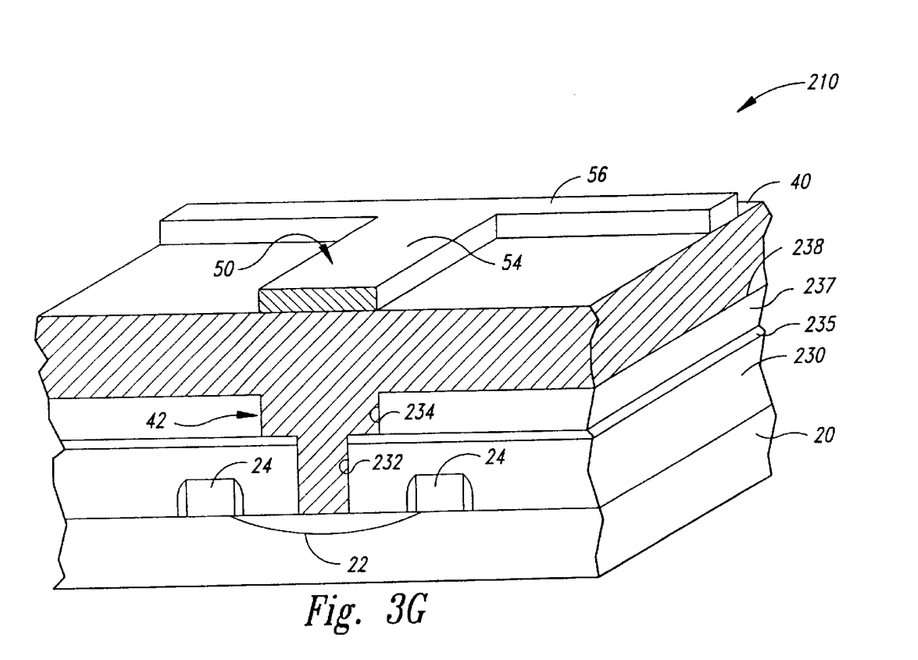
FIG. 3G is a partial schematic isometric view of the substrate of FIGS. 3A–3E at a subsequent point in another embodiment of the method.
Figure 3H:
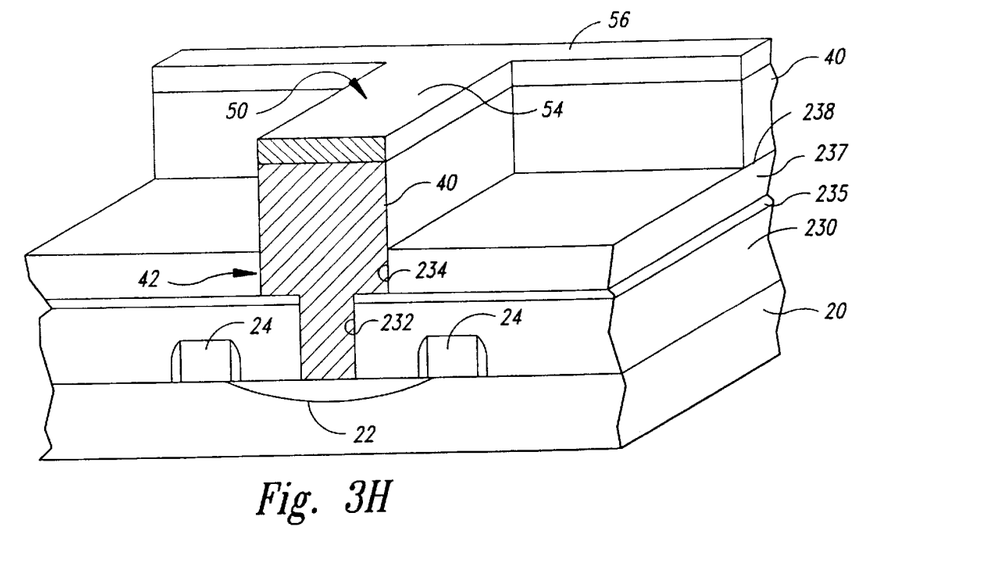
FIG. 3H is a partial schematic isometric view of the substrate of FIG. 3G.
Figure 3I:
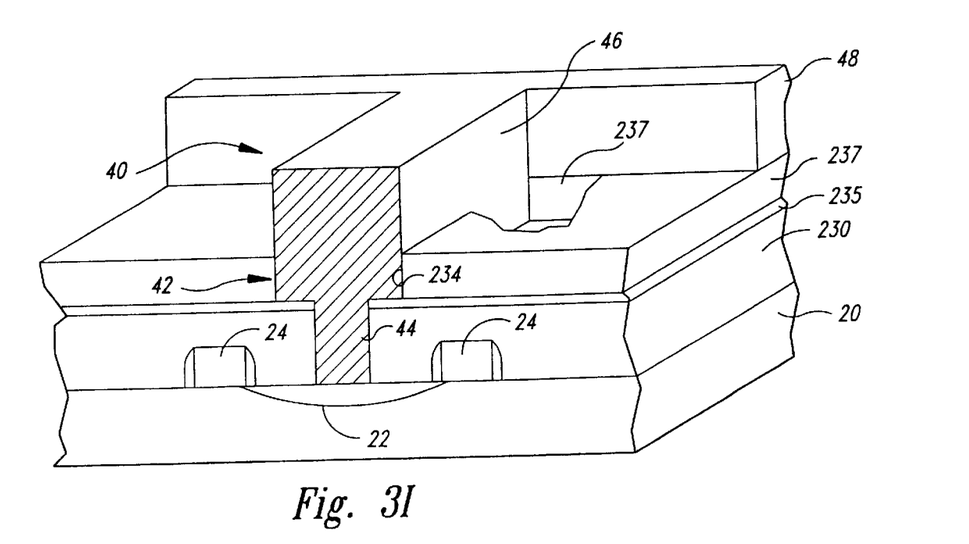
FIG. 3I is a partial schematic isometric view with a cutaway portion of the substrate of FIGS. 3G and 3H at a subsequent point in the method.

FIGS. 3G–3I illustrate another embodiment of the method in which the substrate 210 shown in FIG. 3E is manipulated to form a dual damascene structure and a primary conductive line on the substrate 210. FIG. 3G is a partial schematic isometric view of the substrate 210 that illustrates the second layer 50 after it has been patterned and etched to form a first section 54 over the trench 234 and a second section 56 over an area of the second barrier layer 237 adjacent to the trench 234. The first section 54 provides a protective mask over the trench 234 to form a damascene line from the underlying portion of the first layer 40. Similarly, the second section 56 provides a protective mask to form a primary conductive line from the underlying portion of first layer 40 on top of the second barrier layer 237. The primary conductive line may be a bus line or other high speed line. FIG. 3H is another partial schematic isometric view that illustrates the substrate 210 after the exposed portion of the first layer 40 has been anisotropically etched to the top of the second barrier layer 237. FIG. 3I is a partial schematic isometric view with a cut-away portion that illustrates the substrate 210 after the second layer 50 has been removed to form a primary conductive line 48 coupled to a damascene line 46 formed in accordance with this embodiment of the method.

In addition to the advantages described above, this embodiment of the invention further utilizes the second layer 50 as a hard mask to form both the dual damascene structure and other conductive structures from the same layer of conductive material. Thus, the additional conductive layers and the associated deposition, patterning and removal steps are not necessary to fabricate primary conductive features coupled to the dual damascene structures.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A method of filing depressions in the manufacturing of microelectronic devices, comprising:

covering an underlying layer of a substrate with a component layer having a top surface, the underlying layer having depressions under the cover layer with vacant regions;

forming a mechanical layer on the component layer; and driving a portion of the component layer into the vacant regions of the depressions in the underlying layer with the mechanical layer by applying a pressurized fluid against the mechanical layer, the mechanical layer distributing a driving force over the top surface of the component layer.

2. The method of claim 1 wherein:

the depressions are holes through a dielectric layer on the substrate for forming contact plugs in the dielectric layer and the mechanical layer has a higher yield strength at an operating temperature than the component layer;

covering the substrate comprises depositing a conductive component layer over the substrate; and driving a portion of the component layer by applying a pressurized fluid against the mechanical layer comprises pressing the mechanical layer against the conductive component layer by pressurizing a chamber containing the substrate with a gas.

3. The method of claim 1 wherein:

the depressions are holes through a dielectric layer on the substrate for forming contact plugs in the dielectric layer;

covering the substrate comprises depositing a conductive component layer over the substrate; and driving a portion of the component layer by applying a pressurized fluid against the mechanical layer comprises pressing a silicon nitride mechanical layer against the conductive layer by pressurizing a chamber containing the substrate with a gas.

4. The method of claim 3 wherein the conductive material is aluminum and wherein pressing the silicon nitride layer against the aluminum conductive layer comprises applying pressure to an exposed surface of the silicon nitride layer opposite the aluminum conductive layer.

5. A method of filling voids in the manufacturing of microelectronic devices, comprising:

covering a substrate with a component layer having a top surface by depositing a conductive component layer over a dielectric layer on the substrate, wherein the voids are holes through the dielectric layer for forming contact plugs in the dielectric layer, and wherein the conductive material is aluminum; and driving a portion of the component layer into the voids in the dielectric layer with a mechanical layer, the mechanical layer distributing a driving force over the top surface of the component layer by pressing a silicon nitride mechanical layer against the conductive component layer, wherein pressing the silicon nitride layer against the aluminum conductive layer comprises applying a pressure of 500 to 1000 atmospheres to an exposed surface of the silicon nitride layer opposite the aluminum conductive layer at a temperature of between approximately 400° C. and 600° C.

6. The method of claim 3 wherein the conductive material is copper and wherein pressing the silicon nitride layer against the copper conductive layer comprises applying pressure to an exposed surface of the silicon nitride layer-opposite the copper conductive layer.

7. The method of claim 3 wherein the conductive material is gold and wherein pressing the silicon nitride layer against the gold conductive layer comprises applying pressure to an exposed surface of the silicon nitride layer opposite the gold conductive layer.

8. The method of claim 1 wherein:
the depressions are holes through a dielectric layer on the substrate for forming contact plugs in the dielectric layer;
covering the substrate comprises depositing a conductive layer over the substrate; and
forming the mechanical layer comprises depositing a tungsten layer on the conductive layer.

9. The method of claim 8 wherein the conductive material is aluminum.

10. The method of claim 8 wherein the conductive material is aluminum and wherein driving a portion of the component layer into the voids comprises pressing the tungsten layer against the aluminum conductive layer by applying pressure of 500 to 1000 atmospheres to an exposed surface of the tungsten layer opposite the aluminum conductive layer at a temperature of between approximately 400° C. and 550° C.

11. The method of claim 8 wherein the conductive material is copper and wherein driving a portion of the component layer into the voids comprises pressing the tungsten layer against the copper conductive layer by applying pressure to an exposed surface of the tungsten layer opposite the copper conductive layer.

12. The method of claim 8 wherein the conductive material is gold and wherein driving a portion of the component layer into the voids comprises pressing the tungsten layer against the gold conductive layer by applying pressure to an exposed surface of the tungsten layer opposite the gold conductive layer.

13. The method of claim 1 wherein:
the depressions are holes through a dielectric layer on the substrate for forming contact plugs in the dielectric layer;
covering the substrate comprises depositing a conductive layer over the substrate; and
forming the mechanical layer comprises depositing a hard silicon oxide layer on the conductive layer.

14. The method of claim 13 wherein the conductive material is aluminum.

15. The method of claim 13 wherein the conductive material is aluminum and wherein driving a portion of the component layer into the voids comprises pressing the silicon oxide layer against the aluminum conductive layer by applying pressure of between approximately 500 and 1000 atmospheres to an exposed surface of the silicon oxide layer opposite the aluminum conductive layer at a temperature of between approximately 400° C. and 600° C.

16. The method of claim 13 wherein the conductive material is copper and wherein driving a portion of the component layer into the voids comprises pressing the silicon oxide layer against the copper conductive layer by applying pressure to an exposed surface of the silicon oxide layer opposite the copper conductive layer.

17. The method of claim 13 wherein the conductive material is gold and wherein driving a portion of the component layer into the voids comprises pressing the silicon oxide layer against the gold conductive layer by applying pressure to an exposed surface of the silicon oxide layer opposite the gold conductive layer.

18. The method of claim 1 wherein:
the depressions are trenches in a dielectric layer on the substrate for forming conductive lines in the dielectric layer and the mechanical layer has a higher yield strength at a processing temperature than the component layer;
covering the substrate comprises depositing a conductive component layer over the substrate; and
driving a portion of the component layer comprises pressing the mechanical layer against the conductive layer.

19. The method of claim 1 wherein:
the depressions are trenches formed in a dielectric layer on the substrate and contact holes formed under the trenches in the dielectric layer;
covering the substrate comprises depositing a conductive component layer over the dielectric layer to partially fill the depression; and
driving a portion of the component layer comprises pressing the mechanical layer against the conductive component layer, the mechanical layer having a higher yield strength at a processing temperature than the component layer to distribute the driving force over the component layer.

20. The method of claim 19, further comprising:
forming a hard mask from the mechanical layer to protect first portions of the component layer in the depressions and a second portion of the component layer; and
etching the component layer to form dual damascene structures in the depressions and a primary conductive line commonly coupled to a plurality of the dual damascene structures.

21. The method of claim 2 wherein driving a portion of the component layer comprises pressing a mechanical layer composed of a covalently bonded material against the conductive layer.

22. The method of claim 2 wherein driving a portion of the component layer comprises pressing a mechanical layer having a high yield strength against the conductive layer.

23. The method of claim 2 wherein driving a portion of the component layer comprises pressing a mechanical layer having a high modulus of compressibility against the conductive layer.

24. The method of claim 2 wherein driving a portion of the component layer comprises pressing a silicon oxnitride layer against the conductive layer.

25. The method of claim 2 wherein driving a portion of the component layer comprises pressing a silicon carbide layer against the conductive layer.

26. A method of forming features within depressions in the manufacturing of microelectronic devices, comprising:
covering an underlying layer of a substrate with a first layer of material, the underlying layer having a plurality of depressions under the first layer with vacant regions, and the first layer being deformable at a deformation temperature;

forming a second layer of material on the first layer, the second layer being at least substantially stiff at the deformation temperature; and pressing the second layer against the first layer by applying a pressurized fluid against the second layer at a temperature at least equal to the deformation temperature to drive portions of the first layer into the vacant regions of the depressions in the underlying layer.

27. The method of claim 26 wherein:

the substrate has a dielectric layer with depressions in which conductive features are to be formed, the first layer comprises a conductive layer and the second layer comprises a silicon nitride layer; and pressing the second layer against the first layer comprises applying pressure to an exposed side of the silicon nitride layer to force at least a portion of the conductive layer into the depressions in the dielectric layer.

28. The method of claim 26 wherein:

the substrate has a dielectric layer with depressions in which conductive features are to be formed, the first layer comprises a conductive layer and the second layer comprises a silicon oxide layer; and pressing the second layer against the first layer comprises applying pressure to an exposed side of the silicon oxide layer to force the conductive layer into the depressions in the dielectric layer.

29. The method of claim 26 wherein:

the substrate has a dielectric layer with depressions in which conductive features are to be formed, the first layer comprises a conductive layer and the second layer comprises a tungsten layer; and pressing the second layer against the first layer comprises applying pressure to an exposed side of the tungsten layer to force the conductive layer into the depressions in the dielectric layer.

30. A method of forming features in depressions in the manufacturing of microelectronic devices, comprising driving at least a portion of a first layer of material into vacant regions of the depressions with a second layer of material by applying a pressurized fluid against the second layer at a temperature at which the first layer of material is deformable and the second layer of material is substantially non-deformable.

31. The method of claim 30, further comprising:

covering the substrate with the first layer, the first layer being deformable at a deformation temperature; and forming the second layer on the first layer, the second layer having a higher yield strength than the first layer at the deformation temperature.

32. The method of claim 31 wherein:

the substrate has a dielectric layer with depressions in which conductive features are to be formed, the first layer comprises a conductive layer and the second layer comprises a silicon nitride layer; and driving at least a portion of the first layer into the depressions comprises applying pressure to an exposed side of the silicon nitride layer to force the conductive layer into the depressions in the dielectric layer.

33. The method of claim 31 wherein:

the substrate has a dielectric layer with depressions in which conductive features are to be formed, the first layer comprises a conductive material and the second layer comprises a silicon oxide layer; and driving at least a portion of the first layer into the depressions comprises applying pressure to an exposed side of the silicon oxide layer to force the conductive layer into the depressions in the dielectric layer.

34. The method of claim 31 wherein:

the substrate has a dielectric layer with depressions in which conductive features are to be formed, the first layer comprises a conductive material and the second layer comprises a titanium layer; and driving at least a portion of the first layer into the depressions comprises applying pressure to an exposed side of the titanium layer to force the conductive layer into the depressions in the dielectric layer.

35. A method of forming a conductive feature on a substrate, comprising:

forming a depression in a dielectric layer on the substrate;

covering the dielectric layer and the depression with a conductive layer, the conductive layer having a first yield strength at a deformation temperature;

fabricating a mechanical layer over the conductive layer, the mechanical layer having a second yield strength at the deformation temperature greater than the first yield strength; and applying a force to the mechanical layer at temperature at least as great as the deformation temperature by applying a pressurized fluid against the mechanical layer, the mechanical layer driving at least a portion of the conductive layer into the depression.

36. The method of claim 35 wherein the conductive layer comprises aluminum and the mechanical layer comprises silicon nitride, and wherein applying force to the mechanical layer comprises pressing the mechanical layer against the conductive layer at a pressure of approximately between 50 and 1000 atmospheres and a temperature of approximately between 400° C. and 600° C.

37. The method of claim 35 wherein the conductive layer comprises aluminum and the mechanical layer comprises silicon oxide, and wherein applying force to the mechanical layer comprises pressing the mechanical layer against the conductive layer at a pressure of approximately between 500 and 1000 atmospheres and a temperature of approximately between 400° C. and 600° C.

38. The method of claim 35 wherein the conductive layer comprises aluminum and the mechanical layer comprises tungsten, and wherein applying force to the mechanical layer comprises pressing the mechanical layer against the conductive layer at a pressure of approximately between 700 and 750 atmospheres and a temperature of approximately between 480° C. and 520° C.

39. The method of claim 35 wherein the conductive layer comprises copper and the mechanical layer comprises silicon nitride, and wherein the applying step comprises pressing the silicon nitride mechanical layer against the copper conductive layer.

40. The method of claim 35 wherein the conductive layer comprises copper and the mechanical layer comprises silicon oxide, and wherein the applying step comprises pressing the silicon oxide mechanical layer against the copper conductive layer.

41. The method of claim 35 wherein the conductive layer comprises copper and the mechanical layer comprises tungsten, and wherein the applying step comprises pressing the tungsten mechanical layer against the copper conductive layer.

42. The method of claim 35 wherein the conductive layer comprises gold and the mechanical layer comprises silicon nitride, and wherein the applying step comprises pressing the silicon mechanical layer against the gold conductive layer.

43. The method of claim 35 wherein the conductive layer comprises gold and the mechanical layer comprises silicon oxide, and wherein the applying step comprises pressing the silicon oxide mechanical layer against the gold conductive layer.

44. The method of claim 35 wherein the conductive layer comprises gold and the mechanical layer comprises tungsten, and wherein the applying step comprises pressing the tungsten mechanical layer against the gold conductive layer.

45. In the manufacturing of microelectronic devices on a substrate, a method of forming a dual damascene structure comprising:

depositing a first dielectric layer over the substrate;

planarizing the first dielectric layer;

forming an etch-stop layer over the first dielectric layer;

depositing a second dielectric layer over the etch-stop layer, the etch-stop layer and the second dielectric layer being selectively etchable from one another;

boring contact holes through the second dielectric layer, the etch-stop layer and at least a portion of the first dielectric layer;

etching the second dielectric layer to the etch-stop layer to form trenches in the second dielectric layer over the contact holes;

depositing a conductive layer over the substrate, the conductive layer having a first yield strength at a fill temperature;

covering the conductive layer with a mechanical layer, the mechanical layer having a second yield strength at the fill temperature greater than the first yield strength;

pressing the mechanical layer against the conductive layer at a temperature at least as great as the fill temperature by applying a pressurized fluid against the mechanical layer, the mechanical layer driving at least a portion of the conductive layer into the contact holes and the trenches;

removing at least a portion of the mechanical layer and the conductive layer between the lines to form dual damascene conductive structures in the contact holes and the trenches.

46. The method of claim 45 wherein removing at least a portion of the mechanical layer and the conductive layer between lines comprises planarizing the substrate down to the second dielectric layer.

47. The method of claim 46 wherein planarizing the substrate comprises:

pressing the substrate against a polishing medium; and moving at least one of the polishing pad and the substrate with respect to each other to impart relative motion therebetween and remove material from the substrate.

48. The method of claim 45 wherein removing at least a portion of the mechanical and conductive layers comprises:

forming a hard mask from the mechanical layer to protect first portions of the conductive layer in the holes and trenches, and a second portion of the conductive layer; and etching the conductive layer to form dual damascene structures in the holes and trenches, and a primary conductive line commonly coupled to a plurality of the dual damascene structures.

49. A method of forming features within depressions in the manufacturing of microelectronic devices, comprising:

covering an underlying layer of a substrate with a first layer of material, the underlying layer having a plurality of depressions under the first layer with vacant regions;

forming a second layer of material on the first layer, the second layer being less deformable than the first layer; and pressing the second layer against the first layer by applying a positive fluid pressure against the second layer to drive portions of the first layer into the vacant regions of the depressions in the underlying layer.

* * * * *